US008671317B2

(12) United States Patent
Anzou et al.

(10) Patent No.: US 8,671,317 B2
(45) Date of Patent: Mar. 11, 2014

(54) BUILT-IN SELF TEST CIRCUIT AND DESIGNING APPARATUS

(75) Inventors: Kenichi Anzou, Kawasaki (JP); Chikako Tokunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 247 days.

(21) Appl. No.: 13/231,073

(22) Filed: Sep. 13, 2011

(65) Prior Publication Data

US 2012/0246527 A1    Sep. 27, 2012

(30) Foreign Application Priority Data

Mar. 25, 2011    (JP) .................................. 2011-068335

(51) Int. Cl.
*G11C 29/00*    (2006.01)

(52) U.S. Cl.
USPC ............................ 714/719; 714/733; 714/734

(58) Field of Classification Search
USPC ................. 714/719–720, 710, 715, 728, 730, 714/733–734, 736, 30, 738–739
See application file for complete search history.

(56) References Cited

U.S. PATENT DOCUMENTS

| 2003/0154434 | A1* | 8/2003 | Hou .............................. 714/734 |
| 2006/0179369 | A1* | 8/2006 | Bravo et al. .................... 714/718 |
| 2010/0251043 | A1  | 9/2010 | Anzou et al. |

FOREIGN PATENT DOCUMENTS

| JP | 2003-294813 | 10/2003 |
| JP | 2010-225239 | 10/2010 |

* cited by examiner

*Primary Examiner* — Guy Lamarre
(74) *Attorney, Agent, or Firm* — White & Case LLP

(57) ABSTRACT

According to one embodiment, a semiconductor integrated circuit includes at least one memory and at least one built-in self test (BIST) circuit. In the memory, data can be stored. The BIST circuit tests the memory and includes an address generator. The address generator operates in one of a first operating mode and a second operating mode. In the first operating mode, address signals corresponding to all addresses of the memory are generated. In the second operating mode, the address signals are generated such that each bit of an address input of the memory can be one signal state of both 0 and 1 and such that different bits constitute a set of pieces of data in which the bits choose different signal states at least once.

18 Claims, 17 Drawing Sheets

| CLOCK CYCLE (k) | CORRECT ADDRESS | ACTUAL ADDRESS |
|---|---|---|
| 1 | 00000000 | 00000000 |
| 2 | 00000001 | 00000001 |
| 3 | 00000011 | 00000011 |
| 4 | 00000111 | 00000111 |
| 5 | 00001111 | 00000111 |
| 6 | 00011111 | 00010111 |
| 7 | 00111111 | 00110111 |
| 8 | 01111111 | 01110111 |
| 9 | 11111111 | 11110111 |

FIG. 4

| CLOCK CYCLE (k) | CORRECT ADDRESS | ACTUAL ADDRESS |
|---|---|---|
| 1 | 00000000 | 00001000 |
| 2 | 00000001 | 00001001 |
| 3 | 00000011 | 00001011 |
| 4 | 00000111 | 00001111 |
| 5 | 00001111 | 00001111 |
| 6 | 00011111 | 00011111 |
| 7 | 00111111 | 00111111 |
| 8 | 01111111 | 01111111 |
| 9 | 11111111 | 11111111 |

FIG. 5

| CLOCK CYCLE (k) | CORRECT ADDRESS | ACTUAL ADDRESS |
|---|---|---|
| 1 | 00000000 | 00000000 |
| 2 | 00000001 | 00000001 |
| 3 | 00000011 | 00000011 |
| 4 | 00000111 | 00010111 |
| 5 | 00001111 | 00011111 |
| 6 | 00011111 | 00011111 |
| 7 | 00111111 | 00111111 |
| 8 | 01111111 | 01111111 |
| 9 | 11111111 | 11111111 |

FIG. 6

| STEP | CORRECT ADDRESS | ACTUAL ADDRESS |
|---|---|---|
| 1 | 00000000 | 00000000 |
| 2 | 00000001 | 00000001 |
| 3 | 00000011 | 00000011 |
| 4 | 00000111 | 00010011 |
| 5 | 00001111 | 00011011 |
| 6 | 00011111 | 00011111 |
| 7 | 00111111 | 00111111 |
| 8 | 01111111 | 01111111 |
| 9 | 11111111 | 11111111 |

FIG. 7

| CLOCK CYCLE | SECOND NEXT ADDRESS SIGNAL | |
|---|---|---|
| | FIRST ADDRESS GENERATION METHOD | SECOND ADDRESS GENERATION METHOD |
| 0 | XXXXXXXX | XXXXXXXX |
| 1 | 00000000 | 00000000 |
| 2 | 00000001 | 00000001 |
| 3 | 00000010 | 00000011 |
| 4 | 00000100 | 00000111 |
| 5 | 00001000 | 00001111 |
| 6 | 00010000 | 00011111 |
| 7 | 00100000 | 00111111 |
| 8 | 01000000 | 01111111 |
| 9 | 10000000 | 11111111 |

FIG. 13

| CLOCK CYCLE | INTIALIZATION SIGNAL | ADDRESS UPDATE SIGNAL | SECOND NEXT ADDRESS SIGNAL | | NOTIFICATION SIGNAL |
|---|---|---|---|---|---|
| | | | FIRST ADDRESS GENERATION METHOD | SECOND ADDRESS GENERATION METHOD | |
| 0 | VALID | X | XXXXXXXX | XXXXXXXX | INVALID |
| 1 | INVALID | VALID | 00000000 | 00000000 | INVALID |
| 2 | INVALID | VALID | 00000001 | 00000001 | INVALID |
| 3 | INVALID | VALID | 00000010 | 00000011 | INVALID |
| 4 | INVALID | VALID | 00000100 | 00000111 | INVALID |
| 5 | INVALID | VALID | 00001000 | 00001111 | INVALID |
| 6 | INVALID | VALID | 00010000 | 00011111 | INVALID |
| 7 | INVALID | VALID | 00100000 | 00111111 | INVALID |
| 8 | INVALID | VALID | 01000000 | 01111111 | INVALID |
| 9 | INVALID | VALID | 10000000 | 11111111 | VALID |

FIG. 14

| MARCHING TEST SEQUENCE | ↑↓w0; ↑(r0, w1); ↑(r1, w0); ↓(r0, w1); ↓(r1, w0); ↑: ASCENDING SEQUENCE ↓: DESCENDING SEQUENCE ↑↓: ASCENDING SEQUENCE OR DESCENDING SEQUENCE | | | | |
|---|---|---|---|---|---|
| ADDRESS | STEP 1 | STEP 2 | STEP 3 | STEP 4 | STEP 5 |
| 0 | W(0) | R(0)W(1) | R(1)W(0) | R(0)W(1) | R(1)W(0) |
| 1 | W(0) | R(0)W(1) | R(1)W(0) | . | . |
| 2 | W(0) | R(0)W(1) | R(1)W(0) | . | . |
| . | . | . | . | R(0)W(1) | R(1)W(0) |
| . | . | . | . | R(0)W(1) | R(1)W(0) |
| N-1 | W(0) | R(0)W(1) | R(1)W(0) | R(0)W(1) | R(1)W(0) |

FIG. 15

| MARCHING TEST SEQUENCE | ↑↓w0; ↑(r0, w1); ↑(r1, w0); | | |
|---|---|---|---|
| ADDRESS | STEP 1 | STEP 2 | STEP 3 |
| 0 | W(0) | R(0)W(1) | R(1)W(0) |
| 1 | W(0) | R(0)W(1) | R(1)W(0) |
| 2 | W(0) | R(0)W(1) | R(1)W(0) |
| . | . | . | . |
| . | . | . | . |
| . | . | . | . |
| N-1 | W(0) | R(0)W(1) | R(1)W(0) |

FIG. 16

| CLOCK CYCLE | SECOND DESCENDING NEXT ADDRESS SIGNAL | |
|---|---|---|
| | THIRD ADDRESS GENERATION METHOD | FOURTH ADDRESS GENERATION METHOD |
| 0 | XXXXXXXX | XXXXXXXX |
| 1 | 10000000 | 11111111 |
| 2 | 01000000 | 01111111 |
| 3 | 00100000 | 00111111 |
| 4 | 00010000 | 00011111 |
| 5 | 00001000 | 00001111 |
| 6 | 00000100 | 00000111 |
| 7 | 00000010 | 00000011 |
| 8 | 00000001 | 00000001 |
| 9 | 00000000 | 00000000 |

FIG. 17

BUILT-IN SELF TEST CIRCUIT AND DESIGNING APPARATUS

CROSS REFERENCE TO RELATED APPLICATIONS

This application is based upon and claims the benefit of priority from the prior Japanese Patent Application No. 2011-068335, filed on Mar. 25, 2011, the entire contents of which are incorporated herein by reference.

FIELD

Embodiments described herein relate generally to a built-in self test circuit and a designing apparatus.

BACKGROUND

Conventionally, a Built-in Self Test (BIST) circuit is incorporated into a memory device in a semiconductor integrated circuit, and a failure of the memory device is detected in a production test.

On the other hand, in the test, it is necessary that the BIST circuit generates all addresses of a memory to perform write operation and read operation. Therefore, in the case of the memory having the large number of words, or in the case of the large number of memories, unfortunately it takes a significantly long time to perform a simulation to check connection after the BIST circuit is inserted in a system logic.

BRIEF DESCRIPTION OF THE DRAWINGS

FIG. 4 illustrates the correct address and the actual address in each clock cycle in the case of i=3 of FIG. 3A.

FIG. 5 illustrates the correct address and the actual address in each clock cycle in the case of i=3 of FIG. 3B.

FIG. 6 illustrates the correct address and the actual address in each clock cycle in the case of i=2 and j=4 of FIG. 3C.

FIG. 7 illustrates the correct address and the actual address in each clock cycle in the case of i=2 and j=4 of FIG. 3D.

FIG. 13 illustrates the second next address signal D23 in each clock cycle when the initialization signal is input in a clock cycle 0 of the first embodiment.

FIG. 14 illustrates the initialization signal, the address update signal, the second next address signal D23, and the notification signal D16 in each clock cycle.

FIGS. 15 and 16 illustrate marching test sequences of the first embodiment.

FIG. 17 illustrates the second descending next address signal D26 in each clock cycle when the initialization signal is input in the clock cycle 0 of the second embodiment.

DETAILED DESCRIPTION

Embodiments will now be explained with reference to the accompanying drawings.

In general, according to one embodiment, a semiconductor integrated circuit includes at least one memory and at least one built-in self test (BIST) circuit. In the memory, data can be stored. The BIST circuit tests the memory and includes an address generator. The address generator operates in one of a first operating mode and a second operating mode. In the first operating mode, address signals corresponding to all addresses of the memory are generated. In the second operating mode, the address signals are generated such that each bit of an address input of the memory can be one signal state of both 0 and 1 and such that different bits constitute a set of pieces of data in which the bits choose different signal states at least once.

First Embodiment

A first embodiment will be described. The first embodiment is an example of a semiconductor integrated circuit in which one BIST circuit is connected to one memory.

Figure 1:
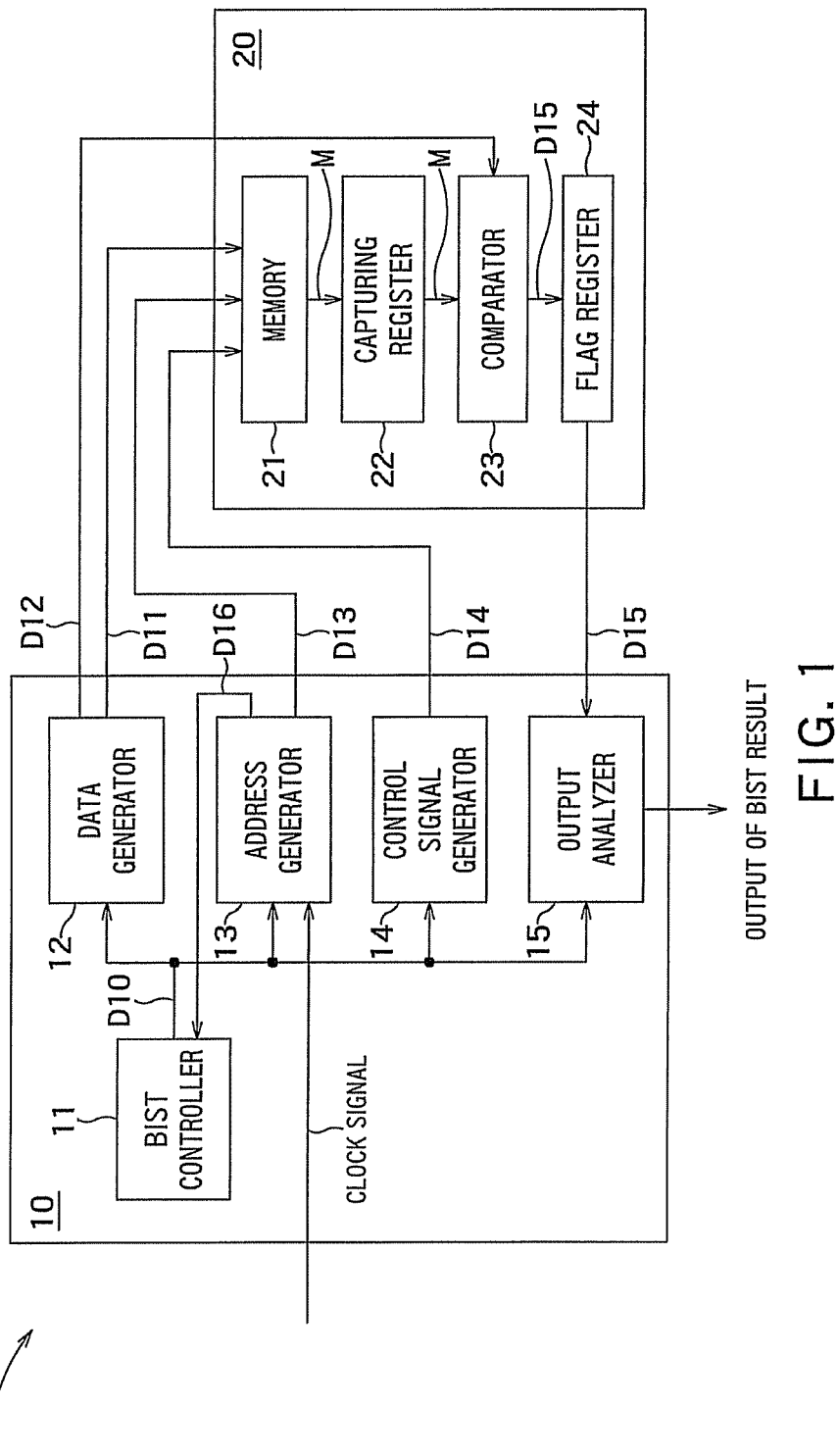
FIG. 1 is a configuration diagram of a semiconductor integrated circuit 1 of the first embodiment.

The semiconductor integrated circuit of the first embodiment will be described. FIG. 1 is a configuration diagram of a semiconductor integrated circuit 1 of the first embodiment.

As illustrated in FIG. 1, the semiconductor integrated circuit 1 includes a BIST circuit 10 and a memory collar 20. The BIST circuit 10 performs the BIST. The memory collar 20 is a block including a target device of the BIST and a test circuit for the target device. A clock signal necessary for the BIST is supplied to the BIST circuit 10. The clock signal is generated by a circuit that is externally connected to the semiconductor integrated circuit 1 or by a clock generator that is provided in the semiconductor integrated circuit 1.

The BIST circuit 10 is what is called a compressor type BIST. The BIST circuit 10 includes a BIST controller 11, a data generator 12, an address generator 13, a control signal generator 14, and an output analyzer 15. The memory collar 20 includes a memory 21, a capturing register 22, a comparator 23, and a flag register 24.

A BIST control signal D10 is a signal that is used to control the data generator 12, the address generator 13, the control signal generator 14, and the output analyzer 15. The BIST control signal D10 includes an initialization signal, an address update signal, and a mode selection signal. The initialization signal is a signal that initializes the address generator 13, the control signal generator 14, and the output analyzer 15. The address update signal is a signal that updates address information that is managed in the address generator 13. The mode selection signal is a signal that is used to select an operating mode (one of a first operating mode and a second operating mode) of the address generator 13.

The data generator 12 generates memory data D11 based on the BIST control signal D10. The memory data D11 should be written in the memory 21. The data generator 12 retains the generated memory data D11 for the predetermined number of clocks (for example, 2 clocks) and outputs the retained memory data D11 as expected data D12. That is, the expected data D12 corresponds to the memory data D11 that is generated before the predetermined number of clocks.

The address generator 13 generates an address signal D13 based on the clock signal and the BIST control signal. The address signal D13 indicates a write address in which the memory data D11 is written. More specifically, the address generator 13 generates the address signals D13 corresponding to all the addresses of the memory 21 in the case in which the mode selection signal indicates the first operating mode, and the address generator 13 generates the address signals D13 corresponding to a part of the addresses of the memory 21 in the case in which the mode selection signal indicates the second operating mode. At this point, the address generator 13 generates the address signal D13 such that each bit varies in each address for the memory data D11 of the address corresponding to the address signal D13 and such that values of plural bits differ from each other at least once. The address generator 13 also generates a notification signal D16. The notification signal D16 indicates whether the address signal D13 is a final address of a test range. When the notification signal D16 indicating the final address is input to the BIST controller 11, the BIST controller 11 generates the initialization signal.

The control signal generator 14 generates a memory control signal D14. The memory control signal D14 is a signal that operates the memory 21 such that the memory data D11 is written in a write address and such that the memory data D11 of the write address is output as a memory output M.

The memory 21 stores the memory data D11 in the write address when an instruction to perform a write operation is issued by the memory control signal D14. The memory 21 outputs the memory data D11 of the write address as the memory output M when an instruction to perform a read operation is issued. For example, the memory 21 is a RAM (Random Access Memory).

The memory output M is input to the capturing register 22, and the capturing register 22 retains the memory output M for the predetermined number of clocks (for example, 1 clock). The capturing register 22 may be eliminated.

The memory output M retained by the capturing register 22 and the expected data D12 are input to the comparator 23, and the comparator 23 compares the memory output M with the expected data D12 to generate flag data D15 that is binary data and indicates whether the memory output M is matched with the expected data D12. For example, the comparator 23 generates flag data "0" when the memory output M is matched with the expected data D12 (that is, there is no difference between the memory output M and the expected data D12), and the comparator 23 generates flag data "1" when the memory output M is not matched with the expected data D12 (that is, there is a difference between the memory output M and the expected data D12).

The flag data D15 is input to the flag register 24, and the flag register 24 retains the flag data D15 for the predetermined number of clocks (for example, 1 clock). The flag register 24 may be eliminated.

The flag data D15 of the test target memory is input to the output analyzer 15, and the output analyzer 15 generates an output of BIST result to externally output the output of BIST result to the semiconductor integrated circuit 1.

Using general logical simulation software, a designer performs a logical simulation of the semiconductor integrated circuit 1 after the BIST circuit 10 is inserted, thereby checking the operation of the BIST circuit 10.

Figure 2:
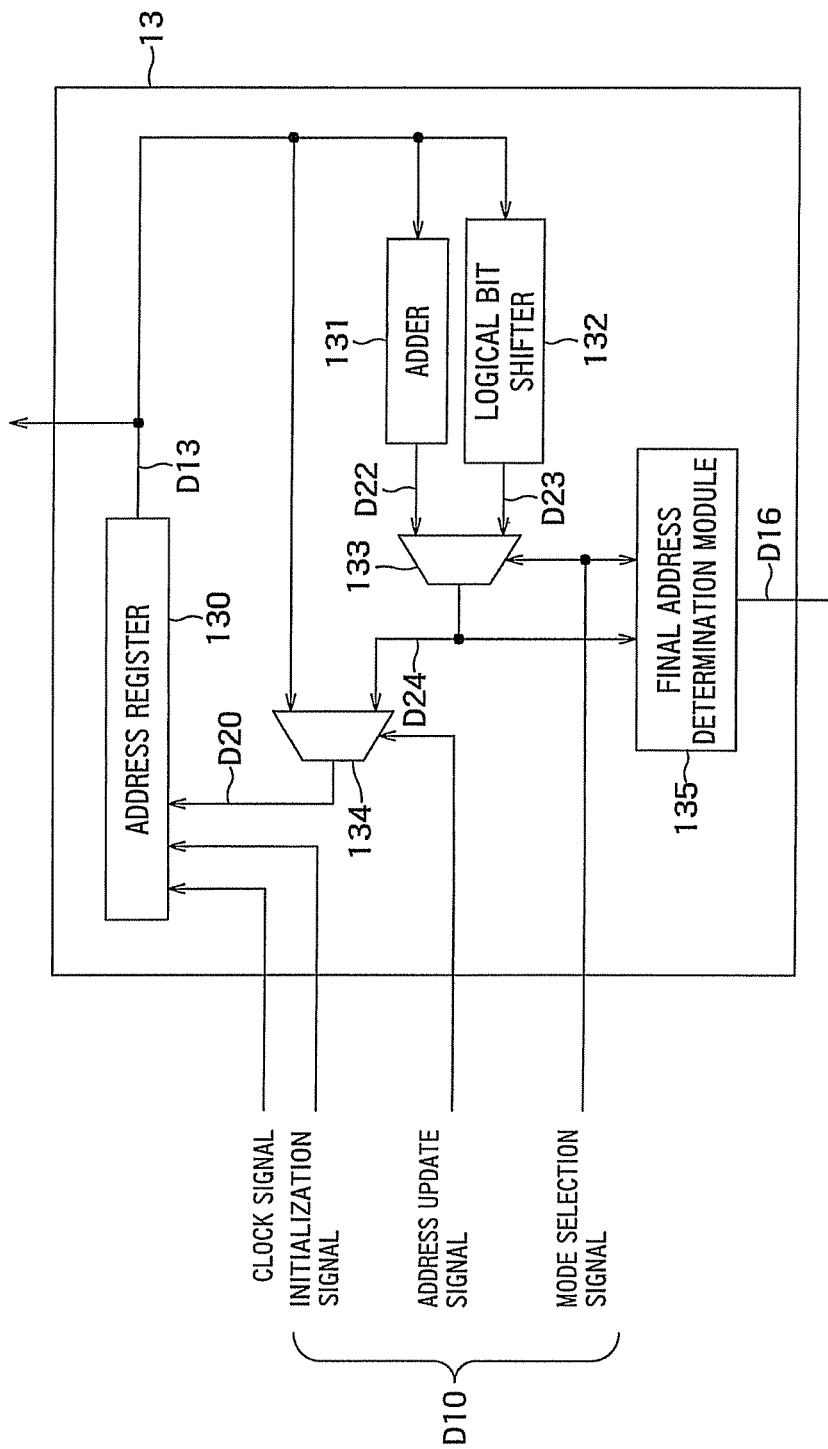
FIG. 2 is a configuration diagram of the address generator 13 of the first embodiment.

The address generator of the first embodiment will be described. FIG. 2 is a configuration diagram of the address generator 13 of the first embodiment.

As illustrated in FIG. 2, the address generator 13 includes an address register 130, an adder 131, a logical bit shifter 132, an address selector 133, a register value selector 134, and a final address determination module 135.

The address register 130 retains a register value D20 selected by the register value selector 134. The address register 130 updates the retained register value D20 (hereinafter referred to as a retained value) in synchronization with the clock signal. That is, the address signal D13 that is of an output of the address register 130 is the register value D0 corresponding to the clock signal. The register value D0 is a signal corresponding to the clock signal, which indicates the address of the memory 21. For example, the register value D0 is an 8-bit bit string. The address register 130 updates the retained value such that the retained value is changed into an initial value based on the initialization signal. For example, the initial value is a signal in which all the 8 bits are all "0".

The adder 131 adds "1" to the address signal D13 to generate a first next address signal D22. The first next address signal D22 includes a bit string of the predetermined number of bits (for example, 8 bits), which indicates an address located in a direction of the address higher than the address corresponding to the clock signal by one. The adder 131 generates the first next address signal D22 every time the clock signal is supplied to the address register 130. Accordingly, the address corresponding to the first next address signal D22 is generated in ascending order from a head address (for example, "00000000") of the memory 21 to an end address (for example, "11111111") of the memory 21. That is, the first next address signal D22 corresponds to all the addresses of the memory 21.

Using either a first or second address generation method, the logical bit shifter 132 shifts the data bit on the address signal D13 in the ascending address direction from the least significant bit to the most significant bit to generate a second next address signal D23. In the first address generation method, the logical bit shifter 132 sets 1 to each bit from the least significant bit to the most significant bit of the address signal D13 every clock cycle. In the second shift method, the logical bit shifter 132 changes a data bit value 0 to 1 at each bit from the least significant bit to the most significant bit of the address signal D13 every clock cycle. Therefore, the second next address signal D23 in FIG. 13 is obtained. FIG. 13 illustrates the second next address signal D23 in each clock cycle when the initialization signal is input in a clock cycle 0. The clock cycle is the number of cycles of the clock signal. As illustrated in FIG. 13, the second next address signal D23 is shifted from the head address "00000000" to the final address "10000000" or "11111111" within the test range of the memory 21 in clock cycles 0 to 9. That is, the second next address signal D23 corresponds to a part of addresses of the memory 21.

The address selector 133 is operated in a first operating mode or a second operating mode based on a mode selection signal. In the first operating mode, the address selector 133 selects the first next address signal D22 generated by the adder 131. In the second operating mode, the address selector 133 selects the second next address signal D23 generated by the logical bit shifter 132. That is, a selection address signal D24 that is of an output of the address selector 133 corresponds to all the addresses of the memory 21 in the first operating mode, and corresponds to a part of addresses of the memory 21 in the second operating mode.

The register value selector 134 selects the address signal D13 or the selection address signal D24 as the register value D0 indicating a next address input based on the address update signal. For example, the register value selector 134 selects the address signal D13 in the case in which the address update signal is in the disable value, and the register value selector 134 selects the selection address signal D24 in the case in which the address update signal is in the enable value. That is, the address register 130 updates the retained value such that the retained value is changed into the selection address signal D24 in the case in which the address update signal is in the enable value, and the register value selector 134 maintains the retained value in the case in which the address update signal is in the disable value.

The final address determination module 135 determines whether the selection address signal D24 is the final address based on the mode selection signal, and generates the notification signal D16 indicating whether the selection address signal D24 is the final address. For example, the final address determination module 135 determines that the signal in which all the bits are "1" (that is, the end address of the memory 21) is the final address in the case in which the mode selection signal indicates the first operating mode. On the other hand, the final address determination module 135 determines whether the selection address signal D24 is the final address based on a final address condition according to the address generation method in the case in which the mode selection signal indicates the second operating mode. For example, the final address condition is that only the most significant bit is "1" in the first address generation method, and the final address condition is that all the bits are "1" in the second address generation method. The final address determination module 135 generates the notification signal D16 indicating "valid" when determining that the selection address signal D24 is the final address, and the final address determination module 135 generates the notification signal D16 indicating "invalid" when determining that the selection address signal D24 is not the final address. FIG. 14 illustrates the initialization signal, the address update signal, the second next address signal D23, and the notification signal D16 in each clock cycle.

The BIST of the first embodiment will be described. FIGS. 3 to 7 are explanatory views of the BIST of the first embodiment.

In the test sequence of the BIST logic of the first embodiment, a marching test, in which a marching pattern is used, is performed. The marching pattern means a test pattern in which a value of a memory cell is altered while all the addresses of the memory 21 are subjected to a one-set operation (what is called a march element) performed to each memory cell of the memory 21.

The operation is performed in the order of ascending or descending address. The operation is expressed by a notation of a marching test sequence of FIG. 15. In the notation of FIG. 15, w0, w1, r0, and r1 indicate the write or read of the value of 0 or 1, respectively. FIG. 15 illustrates the case in which an algorithm called "9N March" is described using the notation. In FIG. 15, a parenthetic portion is the march element.

It is assumed that, in FIG. 16, the marching test sequence of only the ascending address is used. As illustrated in FIG. 16, in the second operating mode, the address generator 13 sequentially shifts each bit of the address input from the initial value in which all the bits are 0 to the state in which the least significant bit to the most significant bit are 1.

Figures 3A, 3C:
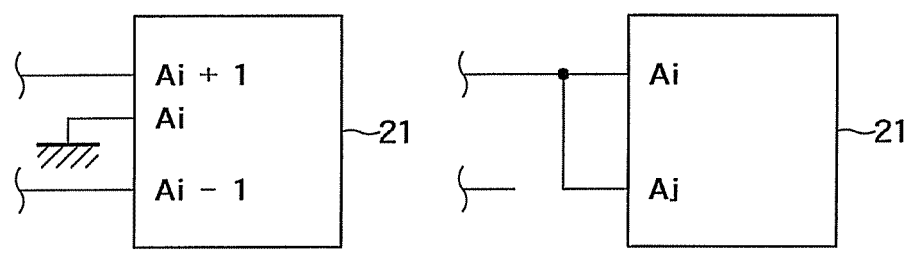
FIGS. 3A-3D illustrate the cases in which a connection failure due to a design mistake.

FIG. 3A illustrates the case in which a connection failure due to a design mistake in which an Ai bit is fixed to "0" occurs in the memory 21. FIG. 4 illustrates the correct address and the actual address in each clock cycle in the case of i=3 of FIG. 3A. As illustrated in FIG. 4, the actual addresses in the clock cycles 4 and 5 are identical to each other.

In the marching test sequence, the data is read from the memory 21 by an address "00000111" in a certain step, and a memory output M "0000 . . . " is compared with expected data D12 "0000 . . . ". In the next step, memory data D11 "1111 . . . " is written in the address "00000111". Then the value of the address register 130 is updated, the data is read from the memory 21 by the address "00001111", and the memory output M is compared with the expected data D12 "0000 . . . ". However, due to the connection failure, the address "00000111" is input to the memory 21. In the address "00000111", the data has been altered to "1111 . . . " in the previous step. As a result of the comparison, the memory output M and the expected data D12 are not matched with each other, and an output of BIST result is detected as an error in a simulation.

Figures 3B, 3D:
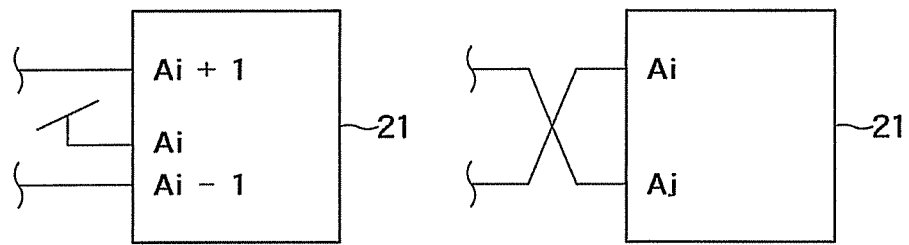

FIG. 3B illustrates the case in which a design failure that the Ai bit is fixed to "1" occurs in the memory 21. FIG. 5 illustrates the correct address and the actual address in each clock cycle in the case of i=3 of FIG. 3B. As illustrated in FIG. 5, the actual addresses in the clock cycles 4 and 5 are identical to each other.

In the marching test sequence, the data is read from the memory 21 by the address "00000111" in a certain step, and the memory output M is compared with expected data D12 "0000 . . . ". In this case, although the address input actually input to the memory 21 becomes "00001111" due to the connection failure, the written value is identical to the normal value. As a result of the comparison, the memory output M and the expected data D12 are matched with each other. In the next step, memory data D11 "1111 . . . " is written in the identical address "00001111". Then the value of the address register 130 is updated, the data is read from the memory 21 by the address "00001111", and the memory output M is compared with the expected data D12 "0000 . . . ". However, in the address "00001111", the data has been altered to "1111 . . . " in the previous step. As a result of the comparison, the memory output M and the expected data D12 are not matched with each other, and the output of BIST result is detected as the error in the simulation.

FIG. 3C illustrates the case in which a connection failure that the address value Ai is always input to an Aj bit occurs in the memory 21. FIG. 6 illustrates the correct address and the actual address in each clock cycle in the case of i=2 and j=4 of FIG. 3C. As illustrated in FIG. 6, the actual addresses in the clock cycles 5 and 6 are identical to each other.

In the marching test sequence, the data is read from the memory 21 by the address "00001111" in a certain step, and the memory output M is compared with expected data D12 "0000 . . . ". In this case, although the address input actually input to the memory 21 becomes "00011111" due to the connection failure, the written value is identical to the normal value. As a result of the comparison, the memory output M and the expected data D12 are matched with each other. In the next step, memory data D11 "1111 . . . " is written in the identical address "00011111". Then the value of the address register 130 is updated, the data is read from the memory 21 by the address "00011111", and the memory output M is compared with the expected data D12 "0000 . . . ". However, in the address "00011111", the data has been altered to "1111 . . . " in the previous step. As a result of the comparison, the memory output M and the expected data D12 are not matched with each other, and the output of BIST result is detected as the error in the simulation.

FIG. 3D illustrates a connection failure that the Ai bit and the Aj bit replace each other occurs at a certain port of the memory 21 having the multi-port. FIG. 7 illustrates the correct address and the actual address in each clock cycle in the case of i=2 and j=4 of FIG. 3D. It is assumed that the memory 21 separately includes the write port and the read port, and it is assumed that the address of the read port is normally connected while the connection failure exists in the address of the write port.

In the marching test sequence, memory data D11 "0000 . . . " is initially written in all the addresses. However, when a value of an address counter becomes "00000111", the address input actually input to the memory 21 becomes "00010011", but the data has not been written yet in the destination address. When the data is read from the read port by the address "00000111", the data is not written in the address "00000111", but an indeterminate value is output. As a result of the comparison, the memory output M and the expected data D12 "0000 . . . " are not matched with each other, and the output of BIST result is detected as the error in the simulation.

According to the first embodiment, the address generator 13 generates the address signals D13 corresponding to all the addresses of the memory 21 in the first operating mode, and generates the address signals D13 corresponding to a part of addresses of the memory 21 in the second operating mode. In other words, the BIST circuit 10 is operated in the first operating mode and the second operating mode. In the first operating mode, the address signals D13 corresponding to all the addresses of the memory 21 are generated. In the second operating mode, the address signals D13 corresponding to a part of addresses of the memory 21 are generated such that each bit of the address input of the memory 21 can be one of both states 0 and 1 and such that different bits constitute a set of pieces of data in which the bits can be different signal states at least once. Therefore, the test range includes a part of addresses of the memory 21 in the second operating mode while including all the addresses of the memory 21 in the first operating mode. Accordingly, compared with the case in which the test range always includes all the addresses of the memory 21, the number of steps necessary to perform the BIST is reduced, and therefore the time necessary to perform the simulation to check the connection after the BIST circuit 10 is inserted in the semiconductor integrated circuit 1 can be shortened.

More specifically, in the case in which all the addresses of the memory 21 are applied to the marching pattern, the number of steps necessary to perform the BIST is a value proportional to $2^N$ (N is an integer indicating an address width). On the other hand, the number of steps is only a value proportional to (N+1) in the second operating mode. This means that, because the number of steps of performing the BIST is proportional to the number of addresses in the marching test, a data amount of the output of BIST result generated in the second operating mode is reduced to $(N+1)/2^N$ than ever before. For example, in the case of N=13, the number of addresses (number of words) of the memory is 8192 in the first operating mode while the number of addresses is only 14 in the second operating mode. That is, the number of steps of performing the BIST is reduced to 14/8192.

Additionally, according to the first embodiment, the address generator 13 generates the address signal D13 of the test range according to the mode selection signal, so that whether a set of operations of the BIST circuit 10 is continuously and correctly performed can be checked without omission for all the memory addresses.

Second Embodiment

A second embodiment will be described below. In the first embodiment, the address is changed only in the ascending order. On the other hand, in the second embodiment, the address is selectively changed in ascending and descending order. The description of the same content as that of the first embodiment is omitted.

The semiconductor integrated circuit 1 of the second embodiment is similar to that of the first embodiment. However, the BIST controller 11 of the second embodiment generates the BIST control signal D10 that further includes an address direction selection signal in addition to the initialization signal, the address update signal, and the mode selection signal. The address direction selection signal indicates one of an ascending mode in which the address signal D13 is generated in ascending order and a descending mode in which the address signal D13 is generated in descending order, namely, address direction of the address signal D13.

Figure 8:
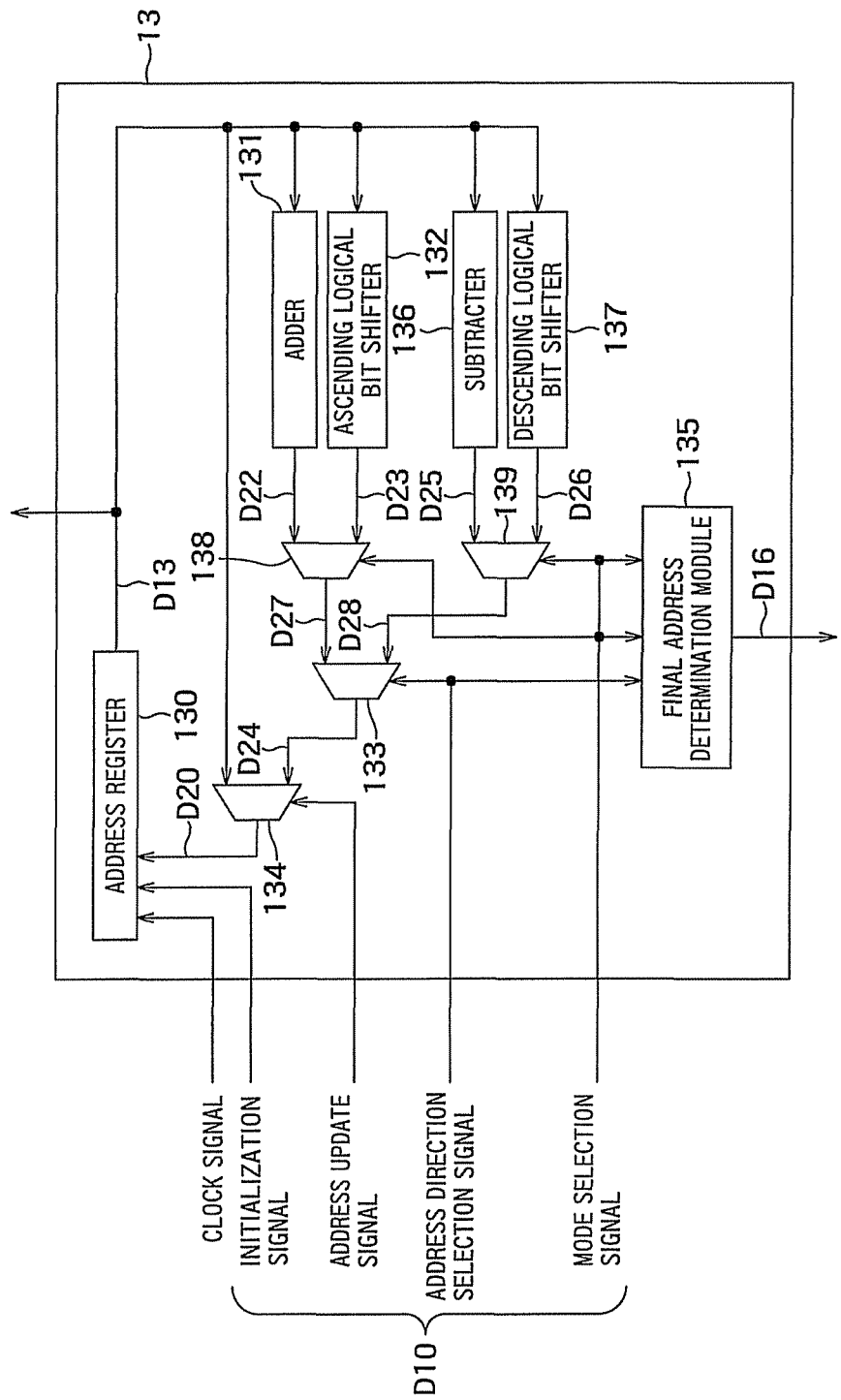
FIG. 8 is a configuration diagram of the address generator 13 of the second embodiment.

An address generator of the second embodiment will be described below. FIG. 8 is a configuration diagram of the address generator 13 of the second embodiment.

As illustrated in FIG. 8, the address generator 13 includes the address register 130, the adder 131, the ascending logical bit shifter 132, the address selector 133, the register value selector 134, the final address determination module 135, a subtractor 136, a descending logical bit shifter 137, an ascending next address selector 138, and a descending next address selector 139. The address register 130, the adder 131, the ascending logical bit shifter 132, and the register value selector 134 are similar to those of the first embodiment.

The subtractor 136 subtracts "1" from the address signal D13 to generate a first descending next address signal D25. The first descending next signal D25 includes the bit string of the predetermined number of bits (for example, 8 bits), which indicates an address located in the descending address direction by one with respect to the address corresponding to the clock signal. The subtractor 136 generates the first descending next address signal D25 every time the clock signal is supplied to the address register 130. Accordingly, the address corresponding to the first descending next address signal D25 is shifted from the end address (for example, "11111111") to the head address (for example, "00000000") of the memory 21. That is, the first descending next address signal D25 corresponds to all the addresses of the memory 21.

Using a third address generation method or a fourth address generation method, the descending logical bit shifter 137 shifts the address signal D13 in the descending address direction to generate a second descending next address signal D26. In the third address generation method, it is the initial value in which only the most significant bit is 1. In the third shift method, the descending logical bit shifter 137 sets 1 to each bit from the most significant bit to the least significant bit of the address signal D13 every clock cycle. In the fourth address generation method, it is the initial value in which all the bits are 1. In the fourth address generation method, the descending logical bit shifter 137 shifts 0 from the most significant bit to the least significant bit of the address signal D13 every clock cycle. Therefore, the second descending next address signal D26 in FIG. 17 is obtained. FIG. 17 illustrates the second descending next address signal D26 in each clock cycle when the initialization signal is input in the clock cycle 0 of the second embodiment. The clock cycle is the number of cycles of the clock signal. As illustrated in FIG. 17, the second descending next address signal D26 is shifted from the head address "11111111" or "10000000" to the final address "00000000" within the test range of the memory 21 in the clock cycles 0 to 9. That is, the second descending next address signal D26 corresponds to a part of addresses of the memory 21.

The ascending next address selector 138 is operated in the first operating mode or the second operating mode based on the mode selection signal. In the first operating mode, the ascending next address selector 138 selects the first ascending next address signal D22 generated by the adder 131. In the second operating mode, the ascending next address selector 138 selects the second ascending next address signal D23 generated by the ascending logical bit shifter 132. That is, a selected ascending next address signal D27 that is an output of the ascending next address selector 138 corresponds to all the addresses of the memory 21 in the first operating mode, and corresponds to a part of addresses of the memory 21 in the second operating mode.

The descending next address selector 139 is operated in the first operating mode or the second operating mode based on the mode selection signal. The descending next address selector 139 selects the first descending next address signal D25 generated by the subtractor 136 in the first operating mode, and selects the second descending next address signal D26 generated by the descending logical bit shifter 137 in the second operating mode. That is, a selected descending next address signal D28 that is an output of the descending next address selector 139 corresponds to all the addresses of the memory 21 in the first operating mode, and corresponds to a part of addresses of the memory 21 in the second operating mode.

The address selector 133 selects the ascending next address signal D27 or the descending signal D28 based on an address direction selection signal. The address selector 133 selects the ascending next address signal D27 in the case in which the address direction selection signal indicates the ascending address direction, and the address selector 133 selects the descending next address signal D28 in the case in which the address direction signal indicates the descending address direction. That is, the selected address signal D24 that is the output of the address selector 133 corresponds to all the addresses of the memory 21 in the first operating mode. In the second operating mode, not only the selection address signal D24 corresponds to a part of addresses of the memory 21. Moreover, in both of the first operating mode and the second operating mode, the selected address signal D24 is generated in the address direction indicated by the address direction signal.

According to the second embodiment, the BIST circuit 10 is operated in one of the ascending mode in which the address input is generated in the ascending order and the descending mode in which the address input is generated in the descending order. In the ascending mode, the BIST circuit 10 sequentially shifts each bit of the address input from the initial value in which all the bits of the address input are 0 to the state in which the least significant bit to the most significant bit are 1. In the descending mode, the BIST circuit 10 sequentially shifts each bit of the address input from the state in which only the most significant bit is 1 to the least significant bit. In both the ascending mode and the descending mode, the BIST circuit 10 finally returns to the state (final address) in which all the bits of the address input are 0. Furthermore, in the descending mode, the address after the final address is "1000 ...". Accordingly, the same effect as the first embodiment can be obtained in both the test pattern in which the address is generated in ascending order and the test pattern in which the address is generated in descending order.

Third Embodiment

A third embodiment will be described below. The third embodiment is an example of a semiconductor integrated circuit in which one BIST circuit is connected to plural memory collars. The description of the same content as that of the first and second embodiments is omitted.

Figure 9:
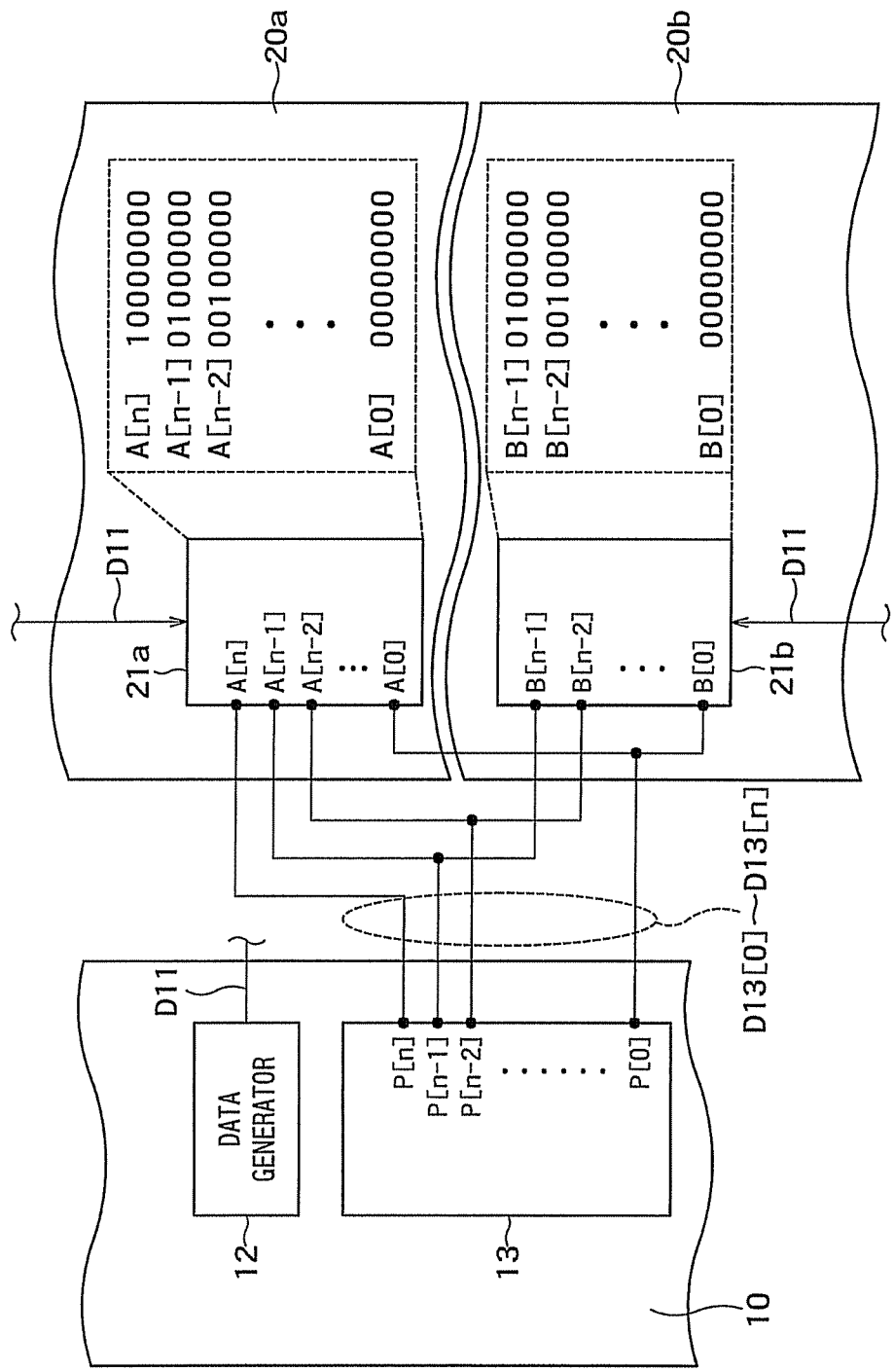
FIG. 9 is a configuration diagram of the semiconductor integrated circuit 1 of the third embodiment.

A semiconductor integrated circuit of the third embodiment will be described below. FIG. 9 is a configuration diagram of the semiconductor integrated circuit 1 of the third embodiment.

As illustrated in FIG. 9, the semiconductor integrated circuit 1 includes the BIST circuit 10 and plural memory collars 20a and 20b. The BIST circuit 10 includes the data generator 12. The plural memory collars 20a and 20b include memories 21a and 21b, respectively. The configuration that is not illustrated in FIG. 9 is similar to that of the first embodiment.

The address generator 13 includes (n+1) (n is an integer of 0 or more) pins P[0] to P[n] that output the address signals D13. The memory 21a includes (n+1) address input pins A[0] to A[n]. The memory 21b includes n address input pins B[0] to B[n−1]. The pins P[0] to P[n−1] are connected to the pins A[0] to A[n−1] and the pins B[0] to B[n−1], respectively. On the other hand, the pin P[n] is connected to only the pin A[n]. That is, the plural memories 21a and 21b differ from each other in an address width.

The address generator 13 generates address signals D13[0] to D13[n]. Then the address generator 13 transmits the address signals D13[0] to D13[n] from the pins P[0] to P[n] to the pins A[0] to A[n] of the memory 21a. On the other hand, the address generator 13 transmits the address signals D13[0] to D13[n−1] from the pins P[0] to P[n−1] to the pins B[0] to B[n−1] of the memory 21b, and invalidates the address signal D13[n] to the memory 21b.

The data generator 12 generates the pieces of memory data D11 to be written in the plural memories 21a and 21b and the pieces of expected data D12 of the memory outputs M of the plural memories 21a and 21b. In the second operating mode, the data generator 12 invalidates the write of the memory data D11 at the address that is not included in a data width of the address signal D13 and the comparison of the memory output M with the expected data D12.

According to the third embodiment, in the second operating mode, the BIST circuit 10 invalidates the write of the memory data D11 and the comparison of the memory output M with the expected data D12. Accordingly, compared with the first and second embodiments, the semiconductor integrated circuit 1 can significantly be shrunk.

Fourth Embodiment

A fourth embodiment will be described below. The comparison type BIST that can be applied to the RAM is described in the first to third embodiments. A compression type BIST that can be applied to not only the RAM but also a ROM (Read Only Memory) is described in the fourth embodiment. The description of the same content as that of the first and second embodiments is omitted.

Figure 10:
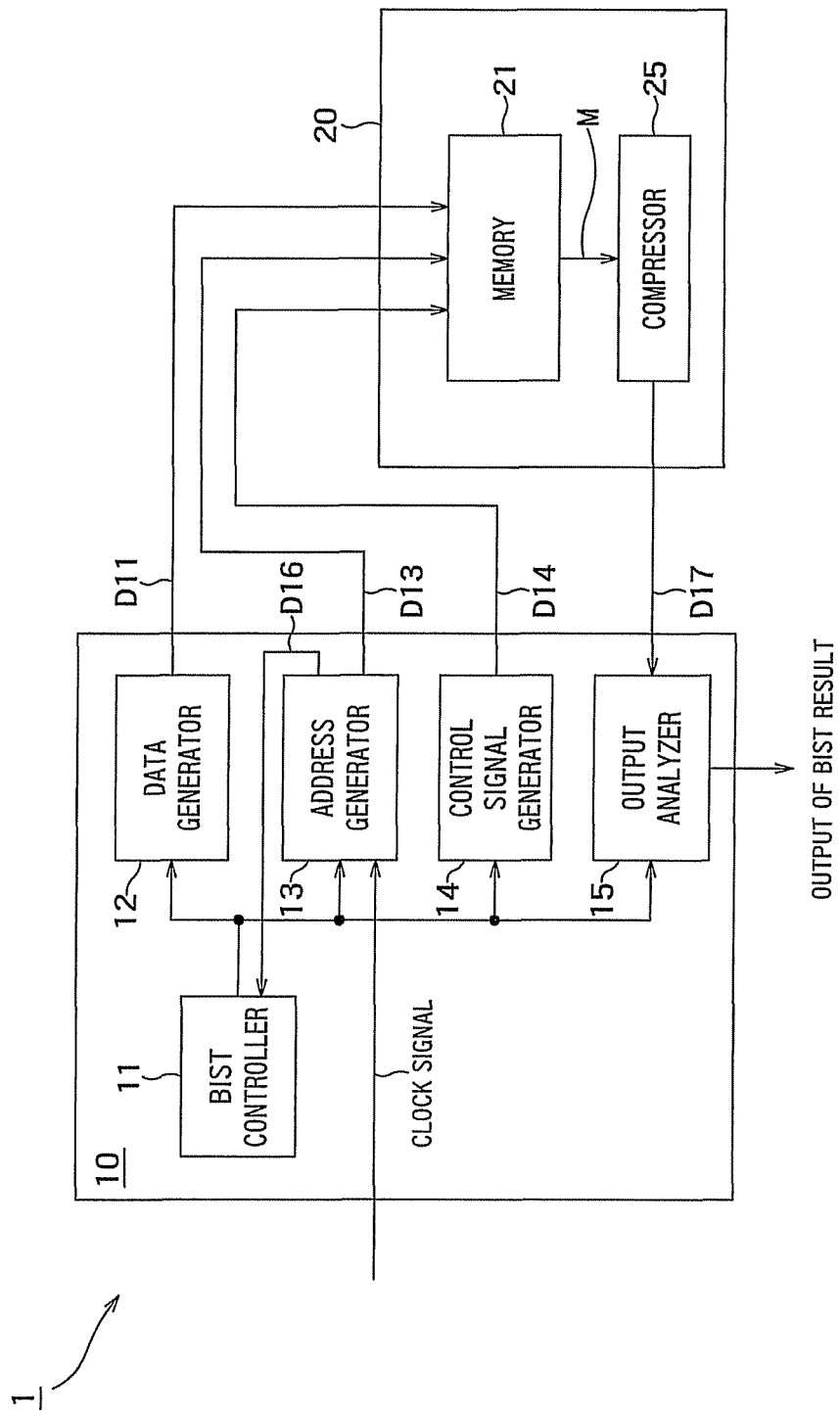
FIG. 10 is a configuration diagram of the semiconductor integrated circuit 1 of the fourth embodiment.

A semiconductor integrated circuit of the fourth embodiment will be described below. FIG. 10 is a configuration diagram of the semiconductor integrated circuit 1 of the fourth embodiment.

As illustrated in FIG. 10, the semiconductor integrated circuit 1 includes the BIST circuit 10 and the memory collar 20. The BIST circuit 10 performs the BIST. The memory collar 20 includes the memory device of the BIST target.

The BIST circuit 10 includes the BIST controller 11, the data generator 12, the address generator 13, the control signal generator 14, and the output analyzer 15. The BIST controller 11, the address generator 13, and the control signal generator 14 are similar to those of the first embodiment. The memory collar 20 includes the memory 21 and a compressor 25.

The data generator 12 generates the memory data D11 based on the BIST control signal D10. The memory data D11 should be written in the memory 21. The data generator 12 does not retain the generated memory data D 11 (that is, the data generator 12 does not output the expected data D12 of the first embodiment).

The memory 21 stores the memory data D11 in the write address when the memory control signal D14 which is the instruction to perform the write operation is issued. The memory 21 outputs the memory data D11 of the write address as the memory output M when the memory control signal D14 which is the instruction to perform the read operation is issued. Unlike the first to third embodiments, the memory 21 may be the RAM or the ROM. In the case of the ROM, the data generator 12 is eliminated because the write operation is not performed.

The memory output M of the memory 21 is input to the compressor 25, and the compressor 25 compresses the input memory output M in order to generate compressed data D17. For example, the compressor 25 is Multiple Input Signature Register (MISR).

In the case of one memory collar 20, the output analyzer 15 outputs the compressed data D17 as BIST data. On the other hand, in the case of the plural memory collars 20, the compressed data D17 output from each memory collar 20 is serially input to the output analyzer 15, and the output analyzer 15 sequentially outputs the compressed data D17 as the BIST performing result.

According to the fourth embodiment, similarly to the first embodiment, the address generator 13 generates the address signals D13 corresponding to all the addresses of the memory 21 in the first operating mode, and generates the address signals D13 corresponding to a part of addresses of the memory 21 in the second operating mode. Accordingly, compared with the case in which the test range always includes all the addresses of the memory 21, the number of steps necessary to perform the BIST is decreased, and therefore the time necessary to perform the simulation to check the BIST can be shortened.

In the case in which the memory 21 is the ROM, ROM data stored in the ROM has randomness. Accordingly, in any logic, expected data of the ROM output cannot be generated. It is not practical that the ROM data is stored in the semiconductor integrated circuit 1 instead of generating the ROM data. Therefore, unlike the first to fourth embodiments, the technique of comparing the memory output M with the expected data D13 cannot be used for the ROM.

Assuming that address signals D13 corresponding to a part of addresses of the memory 21 are generated (that is, the address range is deleted) in the second operating mode like the embodiments while the compressor type BIST is used for the ROM, the randomness of the ROM data becomes a problem. Specifically, when the data is read by the address that is not included in the address signal D13 generated in the second operating mode (that is, the address within the partial range), unfortunately the compressed data D17 that is of the final output compression result becomes identical in the case of the identical pieces of data having the different addresses.

Figure 11:
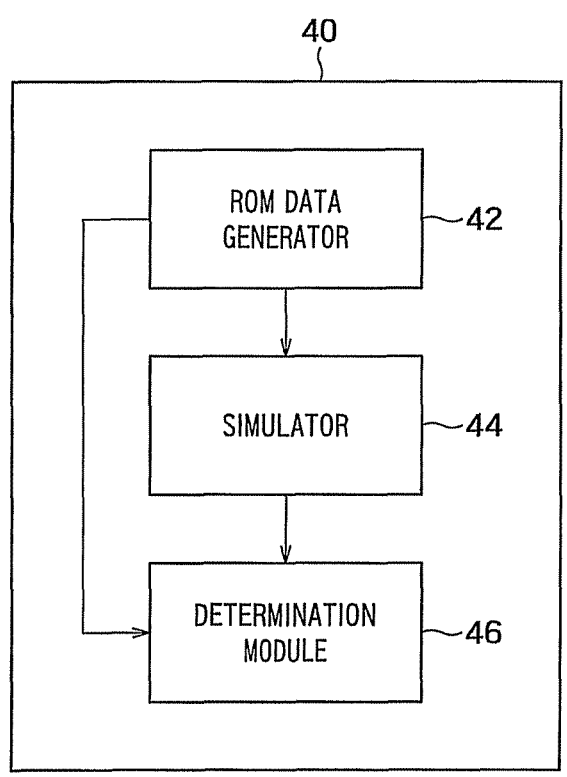
FIG. 11 is a block diagram of a designing apparatus 40 of the fourth embodiment.

A designing apparatus of the fourth embodiment that solves the problem caused by the randomness of the ROM data will be described below. FIG. 11 is a block diagram of a designing apparatus 40 of the fourth embodiment. The designing apparatus 40 of FIG. 11 is Large Scale Integration (LSI) designing apparatus. The designing apparatus 40 includes a ROM data generator 42, a simulator 44, and a determination module 46.

Figure 12:
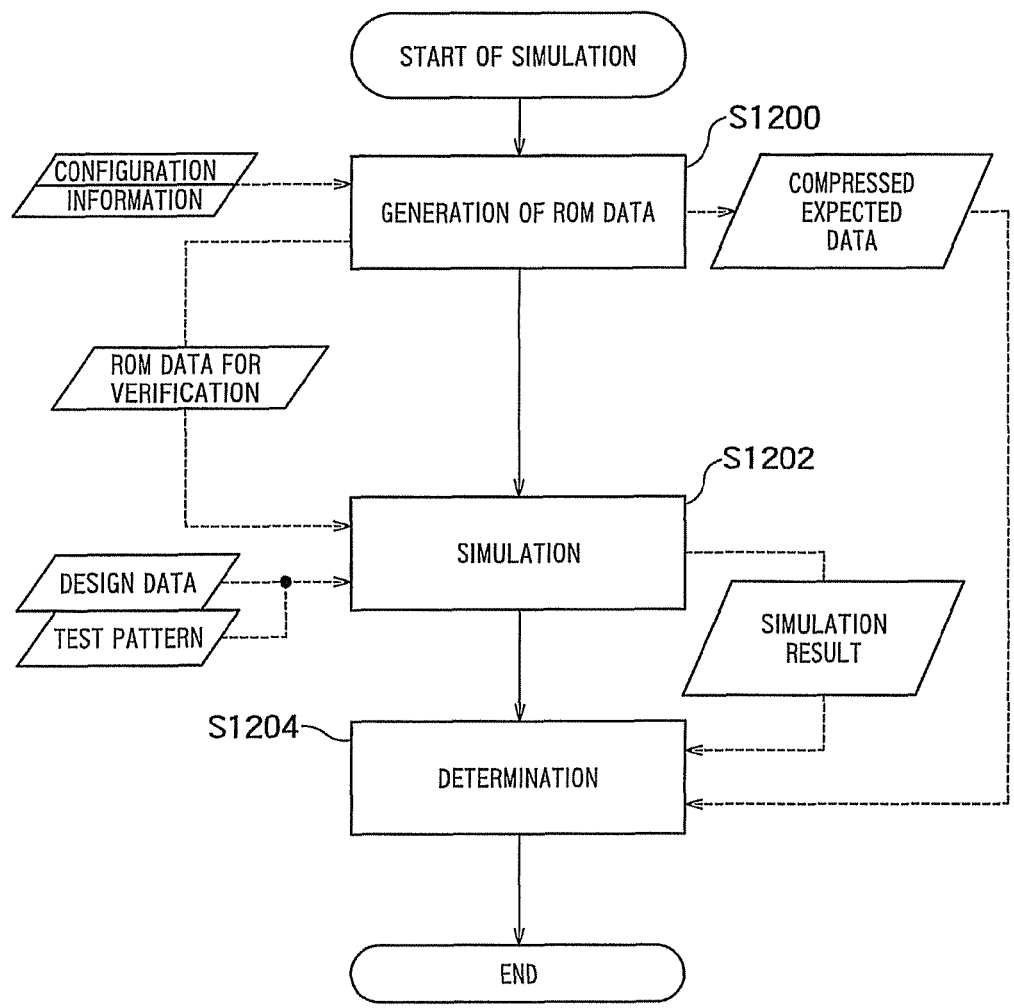
FIG. 12 is a flowchart illustrating the operation of the designing apparatus 40 of the fourth embodiment.

An operation of the designing apparatus 40 of the fourth embodiment will be described. FIG. 12 is a flowchart illustrating the operation of the designing apparatus 40 of the fourth embodiment. The operation of the designing apparatus includes generation of ROM data (S1200), simulation (S1202), and determination (S1204).

<S1200> In order to avoid the problem caused by the randomness of the ROM data, the ROM data generator 42 generates ROM data for verification, which is used in the test operation, from the configuration information indicating a configuration of the ROM device embedded in the system in addition to ROM data for system, which is used in the system that utilizes the semiconductor integrated circuit 1. At this point, the ROM data generator 42 generates the ROM data for verification for the address that is not included in the address signal D13 generated in the second operating mode (that is, the address in the range excluded in the test operation) such that the pieces of data do not overlap each other in the different address. At the same time, the ROM data generator 42 generates compressed expected data indicating a log of a compressed expected data of the BIST performing result. Generally, sometimes a phenomenon (what is called an alias phenomenon) in which failure information is lost as a result of the compression occurs in the compression circuit. Therefore, in the case that a design mistake which is assumed exists, the ROM data generator 42 discards the ROM data for verification when the compression result of the logical simulation in which the ROM data for verification is used is identical to that of the case of no design mistake. Therefore, the ROM data generator 42 generates the ROM data for verification in which the alias phenomenon does not occur.

<S1202> The simulator 44 performs the logical simulation of BIST operation in the test mode using the ROM data for verification, design data, and the test pattern, and the simulator 44 outputs the simulation result of the compressed memory output M. The design data includes a description relating to the configuration of the semiconductor integrated circuit 1 that is the test target. The test pattern data includes a description relating to the operation of the BIST circuit 10.

<S1204> The determination module 46 compares the simulation result output from the simulator 44 with the compressed expected data generated by the ROM data generator 42. The determination module 46 determines "pass" when the simulation result matches with the compressed expected data, the determination module 46 determines "error" when the simulation result does not match with the compressed expected data, and the determination module 46 outputs the determination result "pass" or "error".

According to the fourth embodiment, the address generator 13 and the ROM data generator 42 are used for the ROM device in which the ROM data originally having the randomness is stored. The address generator 13 generates the address signal D13 indicating the address of the range that is excluded in the second operating mode. The ROM data generator 42 generates the ROM data for verification. That is, in the case that the memory 21 is the ROM, the designing apparatus 40 sequentially compresses the memory output M in performing the test, and determines whether the BIST design is correct or not based on the final compression result. The designing apparatus 40 generates the ROM data for verification from the configuration information indicating the configuration of the ROM such that the pieces of data do not overlap each other in the different addresses that are not included in the address signal D13 generated in the second operating mode. The designing apparatus 40 also generates the compressed expected data such that the compression result in the case that any design mistakes exist differs from the compression result in the case that such mistakes do not exist. Accordingly, compared with the case that the logical simulation is performed in all the addresses, the time necessary to check the connection failure can significantly be reduced without degrading the verification accuracy.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
at least one memory in which data can be stored; and
at least one built-in self test (BIST) circuit configured to test the memory and comprising an address generator configured to operate in one of a first operating mode and a second operating mode,
wherein in the first operating mode, address signals corresponding to all addresses of the memory are generated, and
in the second operating mode, a sequence of the address signals corresponding to a part of the addresses of the memory is generated by the address generator such that a signal state of each bit of an address input of the memory changes to a different signal state at least once in accordance with the sequence of the address signals and such that two arbitrary bits of the address input each have a different signal state at least once in accordance with the sequence of the address signals.

2. The semiconductor integrated circuit of claim 1, wherein the address generator sequentially generates the sequence of the address signals such that from the initial state, in which all the bits are 0, a value 1 is set to an index position shifting the position in the generated sequence of the address signals, in the second operating mode.

3. The semiconductor integrated circuit of claim 2, wherein the address generator sequentially generates the sequence of the address signals such that each address signal has only one value of 1 which shifts the index position from the least significant bit to the most significant bit.

4. The semiconductor integrated circuit of claim 3, wherein the BIST circuit further comprises a data generator configured to generate pieces of memory data to be written in a plurality of memories and pieces of expected data of memory outputs of the plurality of memories, to invalidate writing the memory data in the address that is not included in an address range of the memory to be tested, and to invalidate comparing the memory output with the expected data in the second operating mode.

5. The semiconductor integrated circuit of claim 2, wherein the address generator sequentially generates the sequence of the address signals such that the index of the top-most bit which has a value of 1 shifts the position from the least significant bit to the most significant bit and all bits of index less than the top-most index have a value of 1.

6. The semiconductor integrated circuit of claim 2, wherein the BIST circuit further comprises:
an address register configured output a retained value as the address signal;
an adder configured to add 1 into the address signal to generate a first next address signal;
a logical bit shifter configured to shift the address signal in an ascending address direction to generate a second next address signal;
an address selector configured to select the first next address signal in the first operating mode, to select the second next address signal in the second operating mode, and to output a selected address signal corresponding to the first next address signal or the second next address signal;
a register value selector configured to select one of the selected address signal selected by the address selector and the address signal output from the address register, and to output the selected signal as a register value indicating a next address input; and
a final address determination module configured to determine whether the selection address signal is a final address of a test range of the memory based on the mode selection signal and to generate a notification signal indicating whether the selection address signal is the final address,
wherein the address register configured to initialize the retained value in the case in which the notification signal is generated.

7. The semiconductor integrated circuit of claim 2, wherein the BIST circuit further comprises a data generator configured to generate pieces of memory data to be written in a plurality of memories and pieces of expected data of memory outputs of the plurality of memories, to invalidate writing the memory data in the address that is not included in an address range of the memory to be tested, and to invalidate comparing the memory output with the expected data in the second operating mode.

8. The semiconductor integrated circuit of claim 1, wherein in the second operating mode, the address generator operates in an ascending mode in which the address input is shifted in an ascending order and in a descending mode in which the address input is shifted in a descending order.

9. The semiconductor integrated circuit of claim 8, wherein the address generator sequentially generates the series of the address signals such that, in the ascending mode, from the initial state, in which all the bits are 0, a value 1 is set to an index position shifting the position in the generated sequence of the address signals, and in the descending mode, from the initial state, in which at least the most significant bit is 1, a value 1 is set to an index position shifting the position in the generated sequence of the address signals.

10. The semiconductor integrated circuit of claim 9, wherein the address generator sequentially generates the series of the address signals such that each address signal has only one value of 1 which shifts the index position from the least significant bit to the most significant bit in the ascending mode, and from the most significant bit to the least significant bit in the descending mode.

11. The semiconductor integrated circuit of claim 9, wherein the address generator sequentially generates the series of the address signals such that the index of the top-most bit which has a value of 1 shifts the position from the least significant bit to the most significant bit and all bits of index less than the top-most index have a value of 1 in the ascending mode, and such that the index of the top-most bit which has a value of 1 shifts the position from the most significant bit to the least significant bit and all bits of index less than the top-most index have a value of 1 in the descending mode.

12. The semiconductor integrated circuit of claim 8, wherein the BIST circuit further comprises:
an address register configured output a retained value as the address signal;
an adder configured to add 1 into the address signal to generate a first next address signal;
a logical bit shifter configured to shift the address signal in an ascending address direction to generate a second next address signal;
an address selector configured to select the first next address signal in the first operating mode, to select the second next address signal in the second operating mode, and to output a selection address signal corresponding to the first next address signal or the second next address signal;

a register value selector configured to select one of the selected address signal selected by the address selector and the address signal output from the address register, and to output the selected signal as a register value indicating a next address input; and a final address determination module configured to determine whether the selected address signal is a final address of a test range of the memory based on the mode selection signal and to generate a notification signal indicating whether the selection address signal is the final address, wherein the address register configured to initialize the retained value in the case in which the notification signal is generated.

13. The semiconductor integrated circuit of claim 12, wherein the BIST circuit further comprises:

a subtractor configured to subtract 1 from the address signal to generate a first descending next address signal; and a descending logical bit shifter configured to shift the address signal in a descending address direction to generate a second descending next address signal, wherein the address selector selects the first ascending next address signal or the first descending next address signal in the first operating mode, selects the second ascending next address signal or the second descending next address signal in the second operating mode, and outputs a selected address signal corresponding to one of the first ascending next address signal, the first descending next address signal, the second ascending next address signal and the second descending next address signal.

14. The semiconductor integrated circuit of claim 8, wherein the BIST circuit further comprises a data generator configured to generate pieces of memory data to be written in a plurality of memories and pieces of expected data of memory outputs of the plurality of memories, to invalidate writing the memory data in the address that is not included in an address range of the memory to be tested, and to invalidate comparing the memory output with the expected data in the second operating mode.

15. The semiconductor integrated circuit of claim 1, wherein the BIST circuit further comprises:

an address register configured output a retained value as the address signal;

an adder configured to add 1 into the address signal to generate a first next address signal;

a logical bit shifter configured to shift the address signal in an ascending address direction to generate a second next address signal;

an address selector configured to select the first next address signal in the first operating mode, to select the second next address signal in the second operating mode, and to output a selected address signal corresponding to the first next address signal or the second next address signal;

a register value selector configured to select one of the selected address signal selected by the address selector and the address signal output from the address register, and to output the selected signal as a register value indicating a next address input; and a final address determination module configured to determine whether the selected address signal is a final address of a test range of the memory based on the mode selection signal and to generate a notification signal indicating whether the selected address signal is the final address, wherein the address register configured to initialize the retained value in the case in which the notification signal is generated.

16. The semiconductor integrated circuit of claim 15, wherein the BIST circuit further comprises a data generator configured to generate pieces of memory data to be written in a plurality of memories and pieces of expected data of memory outputs of the plurality of memories, to invalidate writing the memory data in the address that is not included in an address range of the memory to be tested, and to invalidate comparing the memory output with the expected data in the second operating mode.

17. The semiconductor integrated circuit of claim 1, wherein the BIST circuit further comprises a data generator configured to generate pieces of memory data to be written in a plurality of memories and pieces of expected data of memory outputs of the plurality of memories, to invalidate writing the memory data in the address that is not included in an address range of the memory to be tested, and to invalidate comparing the memory output with the expected data in the second operating mode.

18. A designing apparatus for the semiconductor integrated circuit of claim 1, wherein, in the case that the memory is a Read Only Memory (ROM), the memory output is sequentially compressed in performing a test, whether the memory is defective or non-defective is determined based on a final compression result, ROM data for verification is generated from configuration information indicating a configuration of the ROM such that pieces of data do not overlap each other in different addresses that are not included in the address signal generated in the second operating mode, and a compressed expected data is generated such that compression result in the case that a connection failure exists in a pin transmitting the address signal differs from compression result in the case that the connection failure does not exist.

* * * * *